United States Patent
Yokoyama et al.

(10) Patent No.: US 6,512,414 B2
(45) Date of Patent: Jan. 28, 2003

(54) AUTOMATIC FILTER TUNING CONTROL SYSTEM

(75) Inventors: Akio Yokoyama, Osaka (JP); Hisashi Takahashi, Osaka (JP); Michiyo Yamamoto, Kyoto (JP); Norihide Kinugasa, Kyoto (JP); Mamoru Arayashiki, Kanagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/901,603

(22) Filed: Jul. 11, 2001

(65) Prior Publication Data

US 2002/0011896 A1 Jan. 31, 2002

(30) Foreign Application Priority Data

Jul. 12, 2000 (JP) .................................... 2000-210939

(51) Int. Cl.[7] ................................................ H03K 5/00
(52) U.S. Cl. ........................................ 327/553; 327/552
(58) Field of Search ........................... 327/552, 553, 327/554; 330/305, 306; 700/28

(56) References Cited

U.S. PATENT DOCUMENTS 5,408,196 A * 4/1995 Sempel et al. ............... 327/553
6,112,125 A * 8/2000 Sandusky ..................... 700/28

FOREIGN PATENT DOCUMENTS

| JP | 63-167511 | 7/1988 |
| JP | 05-114836 | 5/1993 |
| JP | 07-297677 | 11/1995 |
| JP | 2000-59162 | 2/2000 |
| JP | 2000-101392 | 4/2000 |

* cited by examiner

Primary Examiner—Dinh T. Le
(74) Attorney, Agent, or Firm—Nixon Peabody LLP; Thomas W. Cole

(57) ABSTRACT

To tune the center frequency of a gm-C filter, which is a bandpass filter with a narrow bandwidth, to a target frequency, only while the filter is being tuned, the original circuit configuration of the filter is replaced with an alternative configuration that realizes a high signal-to-noise ratio. A characteristic tuner generates and inputs an impulse signal, pulse signal or step signal to the filter being tuned and thereby detects and adjusts the center frequency of the filter. And the tuning result is stored on a nonvolatile memory for future reuse. When the filter is operated, the characteristic tuner stops operating to cut down the power dissipation.

12 Claims, 9 Drawing Sheets

AUTOMATIC FILTER TUNING CONTROL SYSTEM

BACKGROUND OF THE INVENTION

The present invention generally relates to an automatic filter tuning control system for tuning the characteristic frequency of a filter to a target frequency automatically, and more particularly relates to measures to be taken to cut down the power dissipation and increase the precision of the tuning control system. As used herein, the "characteristic frequency" of a bandpass filter means the center frequency thereof, while the "characteristic frequency" of a high- or low-pass filter (HPF or LPF) means the cutoff frequency thereof.

A gm-C filter is often included in an integrated circuit for use in telecommunications. This filter utilizes the mutual conductance (gm; also called "transconductance") and capacitance (C) associated with a transistor to get its frequency characteristics controlled variably in accordance with some physical quantity including voltage and current. Exemplary configurations for filters of this type are disclosed in Japanese Laid-Open Publication Nos. 7-297677 and 2000-101392, for example.

A known automatic filter tuning control system for use in the receiver section of a telecommunications unit tunes a given filter every time the unit receives data, thus dissipating power more than necessarily. As for a cell phone, in particular, its standby mode operation cannot last so long, because a cell phone is normally driven by battery. So when performing the tuning control operation, a cell phone should reduce the power dissipation as much as possible. also, a cell phone now needs a BPF with a bandwidth as narrow as about 5% with respect to the center frequency thereof. Thus, the BPF should have its center frequency controlled highly precisely (on the order of 0.2 to 0.3%) in a shortest possible time.

An automatic filter tuning control system for finely adjusting the dip frequency of a biquadratic (or shortly, biquad) filter, one of gm-C filters of various types, is disclosed in Japanese Laid-Open Publication No. 63-167511 (Japanese Publication for Opposition No. 7-120923). The tuning control system disclosed in this publication is supposed to be built in an integrated circuit as a multiplexed audio frequency demodulator for a TV receiver. The control system inputs a sine wave signal with a constant frequency to a filter to be tuned and controls the output of a digital-to-analog converter (DAC) using a microcomputer, thereby gradually changing the characteristic of the filter. In this control system, the output level of the filter reaches a predetermined reference level for two input values of the DAC. Accordingly, the average of these two DAC input values is regarded as an optimum tuning value and stored on a nonvolatile memory.

Japanese Laid-Open Publication No. 5-114836 discloses an automatic filter tuning control system for finely adjusting the characteristic frequency and quality (Q) factor of a gm-C filter. The Q factor of a filter represents the frequency selectivity thereof. This tuning control system inputs an impulse signal, pulse signal or step signal, not a sine wave signal, to a filter to be tuned. An oscillating waveform appearing at the filter's output is converted by an analog-to-digital converter (ADC) into a digital quantity, which is input to a microcomputer and then subjected to a Laplace transform. In this manner, the microcomputer calculates the characteristic frequency and Q factor of the filter being tuned. After the characteristics of the filter being tuned have been detected in this manner, tuning values are determined for two DACs for use to control the characteristic frequency and Q factor, respectively, thereby adjusting differences between the detected characteristics and the target ones. Then, those tuning values are stored on a nonvolatile memory. And when the filter is operated, the filter will have its characteristics controlled using the tuning values stored on the nonvolatile memory.

A automatic filter tuning control system as disclosed in Japanese Laid-Open Publication No. 2000-59162 inputs an impulse signal or step signal to a filter to be tuned and measures some periods of an oscillating waveform appearing at the filter's output. In accordance with the result of this measurement, the control system detects the characteristic frequency of the filter. And then the control system finely controls the characteristics of the filter in such a manner as to adjust the difference between the characteristic and target frequencies. It should be noted, however, that the control system of this type is supposed to tune the filter every time the supply voltage or temperature has changed.

The known tuning control system disclosed in Japanese Laid-Open Publication No. 63-167511 (Japanese Publication for Opposition No. 7-120923) looks for an optimum tuning value by changing the DAC input value little by little. Thus, it takes a long time to complete the filter tuning of this type. Particularly when this technique is applied to a cell phone, the filter tuning process dissipates too much power because the tuning process is carried out every time the phone sounds. Also, a high-precision analog level detector is hard to realize generally speaking. Accordingly, it is difficult for such a control system to attain that high frequency tuning precision of about 0.2 to 0.3% normally required for a cell phone.

In the conventional tuning control system disclosed in Japanese Laid-Open Publication No. 5-114836, the microcomputer takes charge of the Laplace transform to compute the characteristic frequency and Q factor of the filter being tuned. Thus, the microcomputer should carry too heavy a load.

According to the technique disclosed in Japanese Laid-Open Publication No. 2000-59162, every time the supply voltage or temperature has changed, the filter tuning must be performed, thus also dissipating too much power just for that purpose. Furthermore, if noise is superimposed on the oscillating waveform appearing at the filter's output, then the period measured will have a significant error. In that case, the characteristic frequency cannot be adjusted so precisely.

SUMMARY OF THE INVENTION

It is therefore an object of the present invention to provide a high-precision automatic filter tuning control system that can exhibit so high noise immunity and can reduce its power dissipation so much as to be effectively applicable to the receiver section of a cell phone, for example.

To achieve this object, the control system of the present invention detects and adjusts the characteristic frequency of a filter being tuned using an impulse signal, pulse signal or step signal and then stores the tuning result on a memory for future reuse. In addition, according to the present invention, only while the filter is being tuned, the circuit configuration of the filter is replaced with an alternative configuration that realizes a signal-to-noise ratio (SNR) high enough to control the filter characteristics as intended.

Specifically, an automatic filter tuning control system according to the present invention is for use to tune a characteristic frequency of a filter to a target frequency. The system includes circuit configuration replacing means, characteristic tuner and controller. While the filter is being tuned, the replacing means replaces an original circuit configuration of the filter with an alternative tuning-dedicated circuit configuration. The filter with the alternative configuration has the same characteristic frequency as that of the filter with the original configuration and shows an SNR higher than that of the filter with the original configuration. The characteristic tuner measures one or some periods of an oscillating waveform appearing at the output of the filter with the alternative configuration when an impulse signal, pulse signal or step signal is input as a test signal to the filter. Next, the tuner detects the characteristic frequency of the filter in accordance with the period measured and then supplies a tuning signal to the filter, thereby adjusting a difference between the characteristic and target frequencies. The controller issues a tuning instruction to start the characteristic tuner and then stores a level of the tuning signal when the difference between the characteristic and target frequencies of the filter enters a tolerance range. In operating the filter, the controller restores the filter to the original configuration, stops operating the characteristic tuner and controls the characteristics of the filter using the tuning signal stored.

The circuit configuration replacing means may include means for boosting a gain of the filter being tuned, means for increasing a Q factor of the filter being tuned or means for oscillating the filter being tuned at the characteristic frequency of the filter.

DETAILED DESCRIPTION OF THE INVENTION

Figure 1:
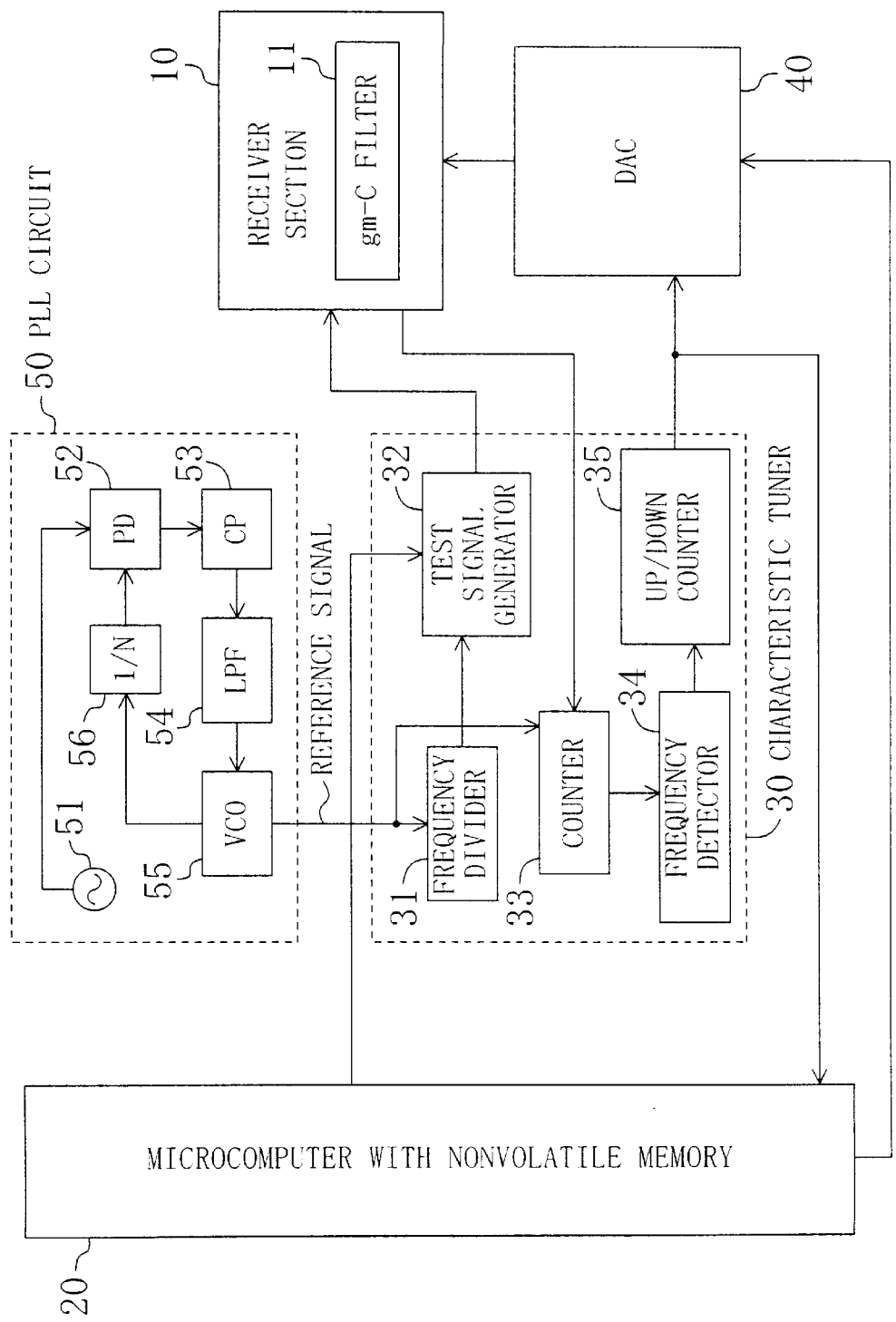
FIG. 1 is a block diagram illustrating an exemplary configuration for an automatic filter tuning control system according to the present invention.

FIG. 1 illustrates an exemplary configuration for an automatic filter tuning control system according to the present invention. In FIG. 1, a receiver section 10 for a telecommunications unit includes a gm-C filter 11, which may be a BPF with a narrow bandwidth. Also, microcomputer 20 with a nonvolatile memory, characteristic tuner 30, DAC 40 and phase-locked loop (PLL) circuit 50 together makes up an automatic filter tuning control system for tuning the center frequency $f_0$ of the gm-C filter 11 to a target frequency $f_{0r}$. As will be described later, the gm-C filter 11 itself can also have its circuit configuration replaced with an alternative tuning-dedicated configuration. The filter 11 with the alternative configuration has the same center frequency $f_0$ as the filter 11 with the original configuration and shows an SNR higher than that of the filter 11 with the original configuration. In the following description, the filter 11 with the original configuration and the filter 11 with the alternative configuration will be referred to as "original filter" and "alternative filter", respectively, for convenience sake.

As shown in FIG. 1, the characteristic tuner 30 includes frequency divider 31, test signal generator 32, counter 33, frequency detector 34 and up/down counter 35 to adjust the difference between the center frequency $f_0$ of the gm-C filter 11 and the target frequency $f_{0r}$ thereof highly precisely. First, the frequency divider 31 divides the frequency fclk (e.g., 88.2 Hz) of a clock signal that has been delivered as a reference signal from the PLL circuit 50. In accordance with a tuning instruction issued from the microcomputer 20, the test signal generator 32. is started so as to generate a test signal from the clock signal with the divided frequency and then supplies the test signal to the gm-C filter 11. This test signal may be of any type (e.g., an impulse signal, pulse signal or step signal) so long as the signal contains a component corresponding to the center frequency $f_0$ of the gm-C filter 11. An impulse signal is particularly preferred because an impulse signal contains sine wave components for all frequencies. In response to the test signal, an oscillating waveform with the frequency $f_0$ appears at the output of the gm-C filter 11. Synchronously with the rise of the clock signal that has been delivered as a reference signal from the PLL circuit 50, the counter 33 measures one or some periods of the oscillating waveform appearing at the output of the gm-C filter 11. Based on the measurement result obtained by the counter 33, the frequency detector 34 detects the center frequency $f_0$ of the gm-C filter 11 and passes a frequency difference $\Delta f$, i.e., the difference between the center and target frequencies $f_0$ and $f_{0r}$, to the up/down counter 35. The up/down counter 35 changes its digital output value as will be described later.

The DAC 40 receives the output value of the up/down counter 35 as a tuning signal and supplies an analog control output (i.e., voltage or current), reflecting the level of the tuning signal, to the gm-C filter 11, thereby adjusting the center frequency $f_0$ of the gm-C filter 11.

To generate a high-precision reference signal for the characteristic tuner 30, the PLL circuit 50 includes temperature-compensated crystal oscillator (TCXO) 51, phase detector (PD) 52, charge pump (CP) 53, LPF 54, voltage-controlled oscillator (VCO) 55 and frequency divider (1/N) 56. The VCO 55 may have an oscillation frequency of 705.6 MHz, for example. Optionally, a programmable counter may be used as the frequency divider 56 to generate a reference signal with an arbitrary frequency other than 88.2 MHz.

The microcomputer 20 with nonvolatile memory issues a tuning instruction to start the test signal generator 32. Thereafter, when the difference between the center and target frequencies $f_0$ and $f_{0r}$ of the gm-C filter 11 enters a predetermined tolerance range, the microcomputer 20 stores the output value of the up/down counter 35 (i.e., the input value of the DAC 40). In operating the receiver section 10 including the gm-C filter 11, the microcomputer 20 stops operating the characteristic tuner 30 and supplies the stored value to the DAC 40. In this manner, the power dissipation of the characteristic tuner 30 can be cut down. Also, a plurality of values, which have been input to the DAC 40 at multiple tuning attempts, may be averaged and the average may be stored on the microcomputer 20. Then, the quantization error of the periods measured can be reduced and the statistic variance decreases. As a result, the tuning precision improves.

Supposing the gm-C filter 11 is a second order BPF, the transfer function H(s) thereof is given by:

$$H(s) = (\omega_0 \times s/Q)/(s^2 + \omega_0 \times s/Q + \omega_0^2) \qquad (1)$$

where $\omega$ is an angular frequency, $\omega_0$ is the center angular frequency of the filter, Q is the Q factor of the filter, $j = \sqrt{(-1)}$ and $s = j\omega$.

The time-domain response of this filter obtained by a Laplace inverse transform is given by $$K_1 \exp\{j(\omega_0/2) \times (-1/Q + \sqrt{(1/Q^2 - 4)})t\} + K_2 \exp\{j(\omega_0/2) \times (-1/Q - \sqrt{(1/Q^2 - 4)})t\} \qquad (2)$$

where t is time and $K_1$ and $K_2$ are constants. If the Q factor is very large, then the time-domain response will be $$K_1 \exp(j\omega_0 t) + K_2 \exp(-j\omega_0 t) \qquad (3)$$

As a result, an oscillating waveform with the center angular frequency $\omega_0$ will appear at the output of the filter. That is to say, if a test signal, containing a component corresponding to the center frequency $f_0$ of the gm-C filter 11, is supplied to the gm-C filter 11, then the oscillating waveform with the frequency $f_0$ will appear at the output of the filter 11 responsive to the signal.

In this case, the test signal supplied to the gm-C filter 11 preferably has an iterative frequency that is half or less as high as the center frequency $f_0$ of the gm-C filter 11. This is because the counter 33 never fails to keep time for at least one period in that case. Supposing $N_c$ is a count for a number M of periods associated with the center frequency $f_0$, the following relationship $$f_0 = fclk \times M/N_c \qquad (4)$$

is met. Accordingly, to detect the center frequency $f_0$ highly precisely, the clock signal, delivered as a reference signal from the PLL circuit 50 to the counter 33, should have its frequency fclk increased and the number M of periods to be measured should also be increased.

Figure 2:
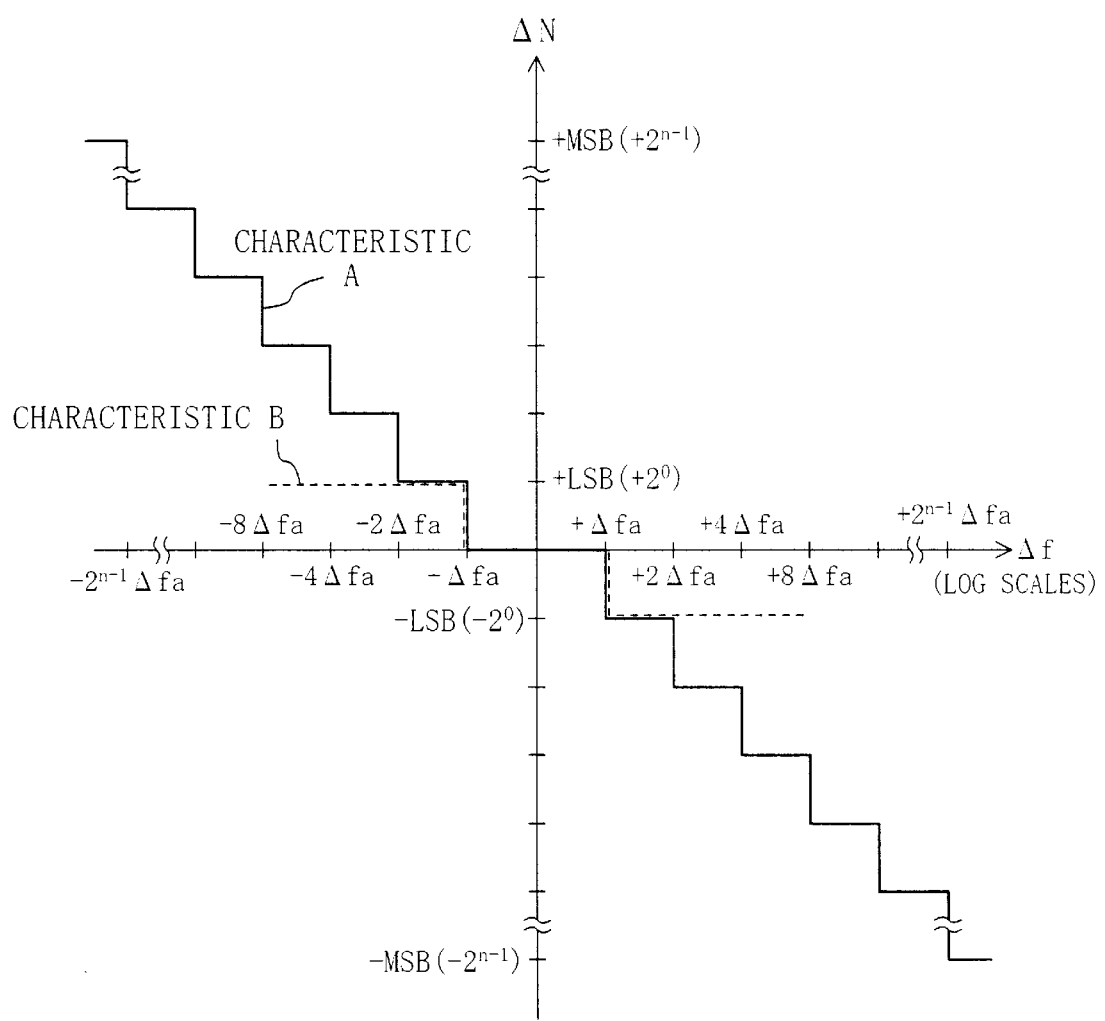
FIG. 2 is a graph illustrating how the up/down counter shown in FIG. 1 operates.

FIG. 2 illustrates how the up/down counter 35 shown in FIG. 1 operates. The abscissa represents, on a logarithmic scale, the difference between the center frequency $f_0$ detected and the target frequency $f_{0t}$, or the frequency difference $\Delta f$ of the gm-C filter 11, while the ordinate represents the change $\Delta N$ in the output value of the up/down counter 35. In FIG. 2, $\Delta f_a$ is a quantized frequency difference. As indicated by the solid line (representing the characteristic A) in FIG. 2, the greater the frequency difference $\Delta f$, the more greatly the up/down counter 35 changes its output value. As a result, the center frequency can be adjusted faster and the power dissipation can be reduced. Also, as indicated by the dashed line (representing the characteristic B), the up/down counter 35 is so constructed as to decrease the control sensitivity of its output value when the center frequency $f_0$ detected is close to the target frequency $f_{0t}$. In this manner, the control is not disturbed by extraneously incoming noise so much and the center frequency can be adjusted more stably. It should be noted that the bits input to the up/down counter 35 may be either 2n bits, each weighted with $\pm 2k$ (where $0 \leq k \leq n-1$ and n and k are integers), or 2 bits representing up and down, respectively.

Figure 3:
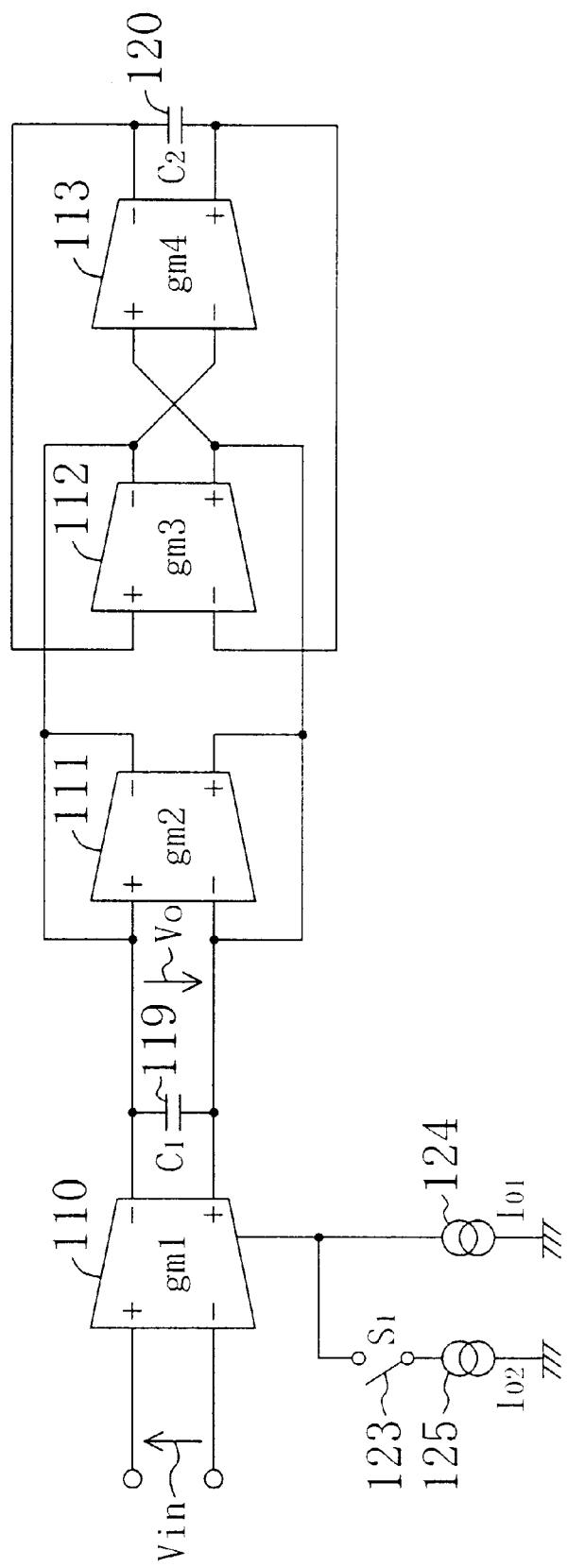
FIG. 3 is a block diagram illustrating a first exemplary configuration for the gm-c filter shown in FIG. 1.

FIG. 3 illustrates a first exemplary configuration for the gm-C filter 11 shown in FIG. 1. The gm-C filter 11 shown in FIG. 3 is a second order BPF including four transconductance (gm) amplifiers 110, 111, 112 and 113 and two capacitors 119 and 120. The gm amplifiers 110, 111, 112 and 113 have transconductances gm1, gm2, gm3 and gm4 and the capacitors 119 and 120 have capacitances $C_1$ and $C_2$, respectively. In FIG. 3, Vin is the input voltage of the filter 11 and Vo is the output voltage of the filter 11 appearing between the two terminals of the capacitor 119. Four variable current sources are actually connected to the four gm amplifiers 110 through 113 to control the characteristic of the filter variably in accordance with the analog control output of the DAC 40. However, in FIG. 3, only one current source $I_{O1}$ 124 connected to the initial-stage gm amplifier 110 is illustrated for the sake of simplicity. This initial-stage gm amplifier 110 determines the gain of the gm-C filter 11 and is further connected to another current source $I_{O2}$ 125 by way of a switch $S_1$ 123. The current source $I_{O2}$ 125 is used exclusively for filter tuning purposes. The transfer function H(s), gain G, center angular frequency $\omega_0$ and Q factor Q of the gm-C filter 11 shown in FIG. 3 are given by $$H(s) = (s \cdot gm1/C_1)/\{(s^2 + s \cdot gm2/C_1 + gm3 \cdot gm4/(C_1 \cdot C_2)\} \qquad (5)$$

$$G = gm1/gm2 \qquad (6)$$

$$\omega_0 = 2\pi f_0 = \sqrt{\{gm3 \cdot gm4/(C_1 \cdot C_2)\}} \qquad (7)$$

$$Q = \sqrt{(gm3 \cdot gm4 \cdot C_1/C_2)}/gm2 \qquad (8)$$

Figure 4:
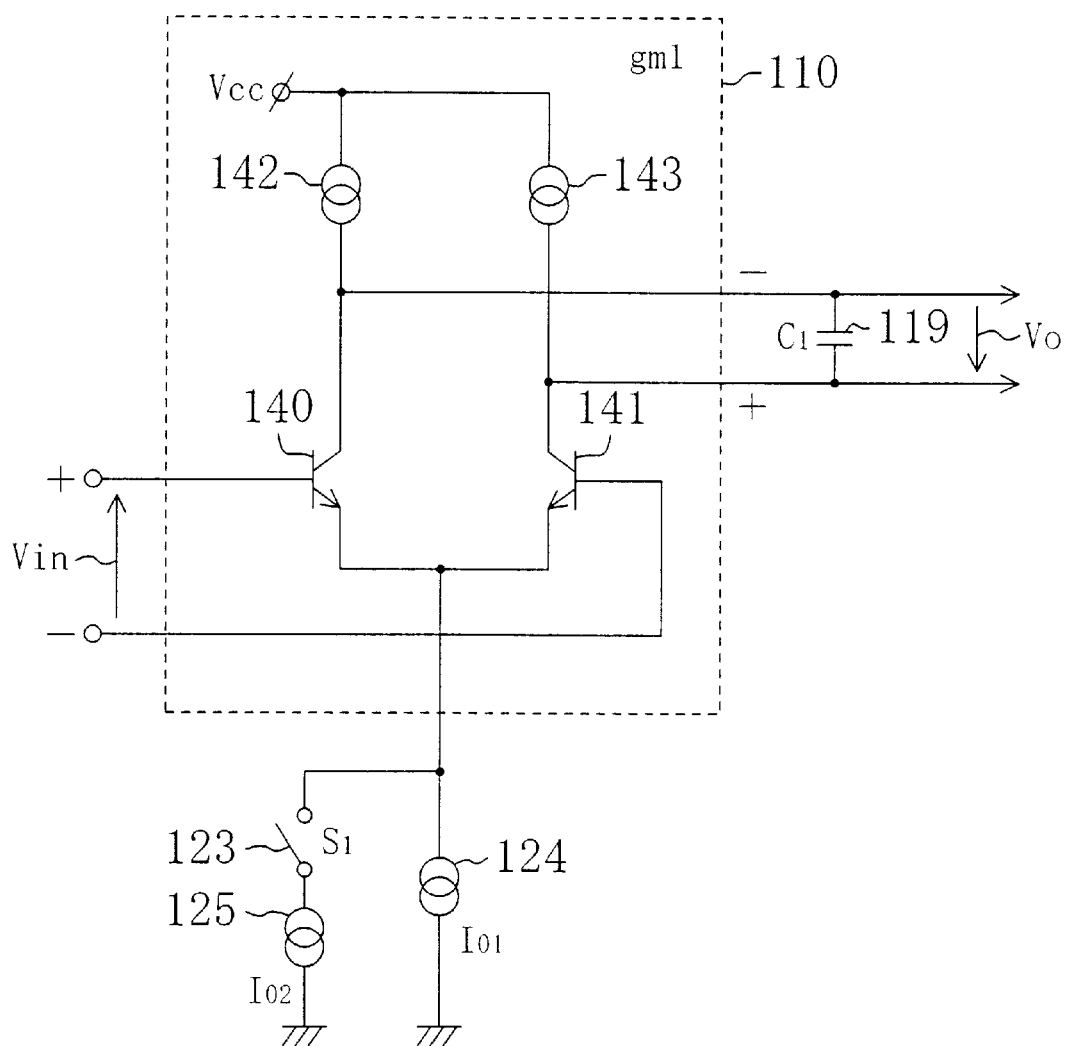
FIG. 4 is a circuit diagram illustrating an exemplary internal configuration for the initial-stage transconductance amplifier shown in FIG. 3.

FIG. 4 illustrates an exemplary internal configuration for the initial-stage gm amplifier 110 shown in FIG. 3. The initial-stage gm amplifier 110 includes two bipolar transistors 140 and 141 and two current sources 142 and 143. In FIG. 4, Vcc is a power supply. The bipolar transistors 140 and 141, along with the capacitor 119 and current sources 142 and 143, form an integrator. Each of the other gm amplifiers 111, 112 and 113 shown in FIG. 3 also has the same internal configuration as the initial-stage gm amplifier 110 shown in FIG. 4. It should be noted that the bipolar transistors 140 and 141 may be replaced with MOSFETs.

The switch 123 is closed only while the filter is being tuned. The common emitter current of the transistors 140 and 141 is $I_{O1}$ while the switch 123 is open, but changes into $I_{O1} + I_{O2}$ when the switch 123 is closed. The threshold voltage Vt of each of these transistors 140 and 141 is given by $$Vt = kT/q \qquad (9)$$

where T is the temperature, k is a Boltzmann constant and q is the charge of electron. The transconductance gm1 of this gm amplifier 110 while the filter 11 is not being tuned is $$gm1 = I_{O1}/Vt \qquad (10)$$

On the other hand, while the filter 11 is being tuned, the transconductance gm1 of this gm amplifier 110 is $$gm1 = (I_{O1} + I_{O2})/Vt \qquad (11)$$

Thus, it can be seen from Equations (6), (10) and (11) that while the filter 11 is being tuned, gm1 increases and boosts the gain of the gm-C filter 11. However, as can be seen from Equations (7) and (8), even if gm1 increases, the center angular frequency and Q factor of the gm-C filter 11 do not change.

A main noise source for the gm amplifier 110 shown in FIG. 4 may be shot noise generated by the transistors 140 and 141. supposing the common emitter current of the transistors 140 and 141 is $I_O$ (which is equal to either $I_{O1}$ or $I_{O1} + I_{O2}$) and the bandwidth is $\Delta F$. the shot noise In is given by $$In^2 = 2qI_O \Delta F \qquad (12)$$

The equivalent input noise Vn of the initial-stage gm amplifier 110 is given by $$Vn = \sqrt{(In^2)}/gm1 = \sqrt{(2qI_O \Delta F)}/I_O/Vt = Vt\sqrt{(2q\Delta F/I_O)} \qquad (13)$$

That is to say, if the current $I_0$ increases while the filter is being tuned, the equivalent input noise decreases and the SNR of the gm-C filter 11 increases.

As can be seen, while the gm-C filter 11 shown in FIG. 3 should have its characteristic controlled, the filter 11 can increase its gain by closing the switch 123. Accordingly, the filter 11 serves as an alternative tuning-dedicated filter that has the same center frequency $f_0$ as the original filter and an SNR higher than that of the original filter. As a result, high-precision filter tuning control is realized without being affected by extraneous noise seriously. The ON/OFF states of the switch 123 are controlled either by the test signal generator 32, which is started in accordance with the tuning instruction issued from the microcomputer 20, or by the microcomputer 20 itself. On the other hand, when the receiver section 10 including the gm-C filter 11 operates, the switch 123 is opened to restore the filter 11 to its original configuration. As a result, the gm-C filter 11 can also reduce its own power dissipation.

Figure 5:
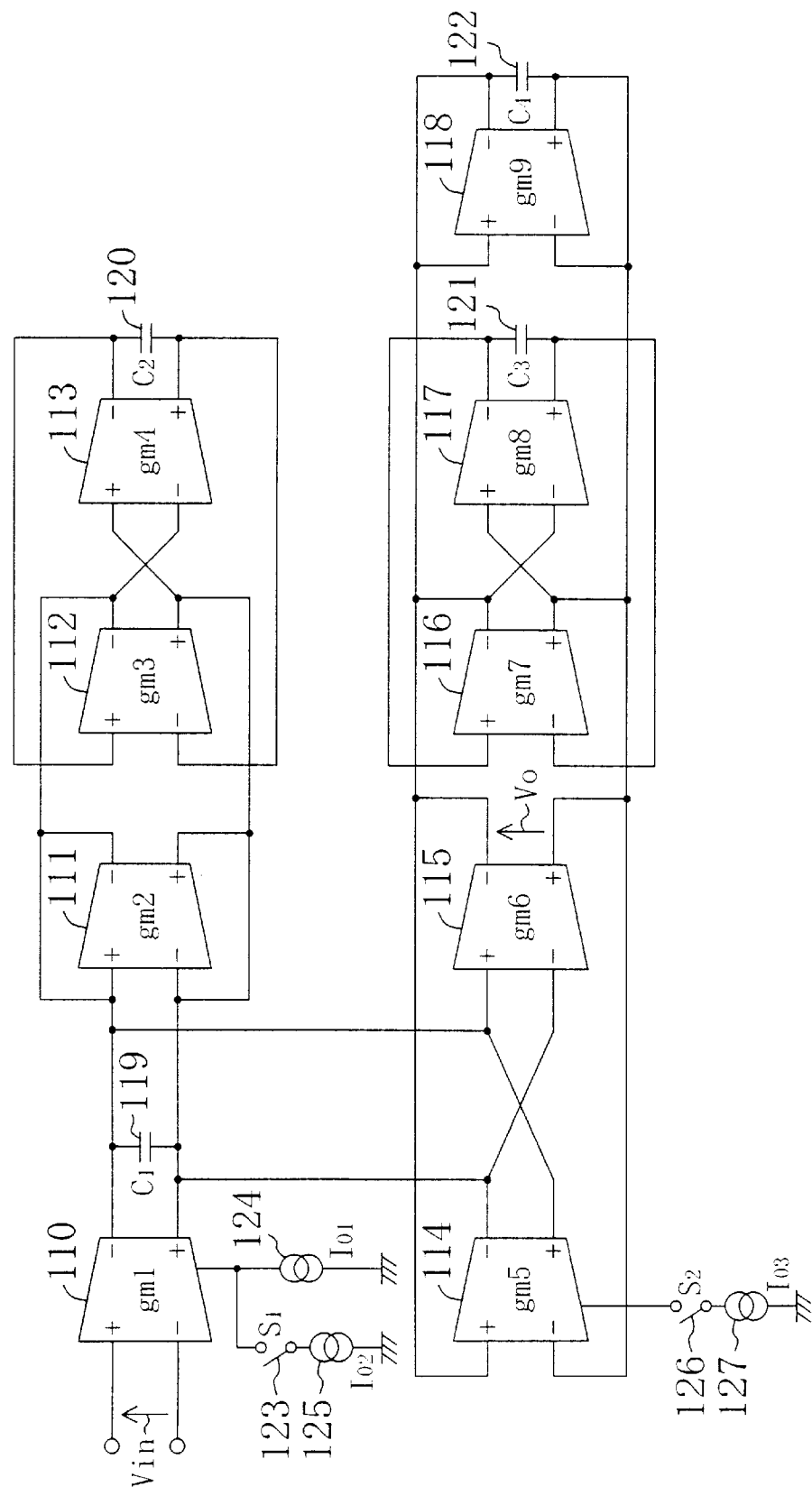
FIG. 5 is a block diagram illustrating a second exemplary configuration for the gm-C filter shown in FIG. 1.

FIG. 5 illustrates a second exemplary configuration for the gm-C filter 11 shown in FIG. 1. The gm-C filter 11 shown in FIG. 5 is a 4th order BPF including not only all the components of the filter 11 shown in FIG. 3 but also five more gm amplifiers 114, 115, 116, 117 and 118 and two more capacitors 121 and 122. The gm amplifiers 114, 115, 116, 117 and 118 have transconductances gm5, gm6, gm7, gm8 and gm9 and the capacitors 121 and 122 have capacitances $C_3$ and $C_4$, respectively. In FIG. 5, Vin is the input voltage of the filter 11 and Vo is the output voltage of the filter 11 appearing between the two terminals of the capacitor 122. Five variable current sources are actually connected to the five gm amplifiers 114 through 118 to control the characteristic of the filter variably in accordance with the analog control output of the DAC 40. However, in FIG. 5, only one $I_{03}$ 127 of the five current sources, which is connected to the gain-adjusting gm amplifier 114, is illustrated for the sake of simplicity. It should be noted that this current source $I_{03}$ 127 is connected to the gm amplifier 114 by way of a switch $S_2$ 126, which is opened only while the filter 11 is being tuned.

In the gm-C filter 11 shown in FIG. 5, when the switch 126, which has connected the gm amplifier 114 and current source 127 together, is opened, a path, through which the output voltage Vo of the filter 11 is fed back to the input of the gm amplifier 115, is disconnected. As a result, the 4th order BPF changes into two cascaded second order BPFs. In that case, the initial-stage second order BPF is made up of the four gm amplifiers 110 through 113 and the two capacitors 119 and 120, while the second-stage BPF is made up of the four gm amplifiers 115 through 118 and the two capacitors 121 and 122. This switching does not change the center frequency of the gm-C filter 11 but does increase the Q factor thereof by $1/(\sqrt{2}-1)\approx 2.4$. Consequently, the bandwidth of the gm-C filter 11, defined as the width of a range where the attenuation is no greater than 3 dB, is reduced to about 1/2.4 and the band noise decreases. In addition, since the Q factor increases, the oscillating frequency is stabilized at the filter output, thus improving the precision of the filter tuning control.

Figure 6:
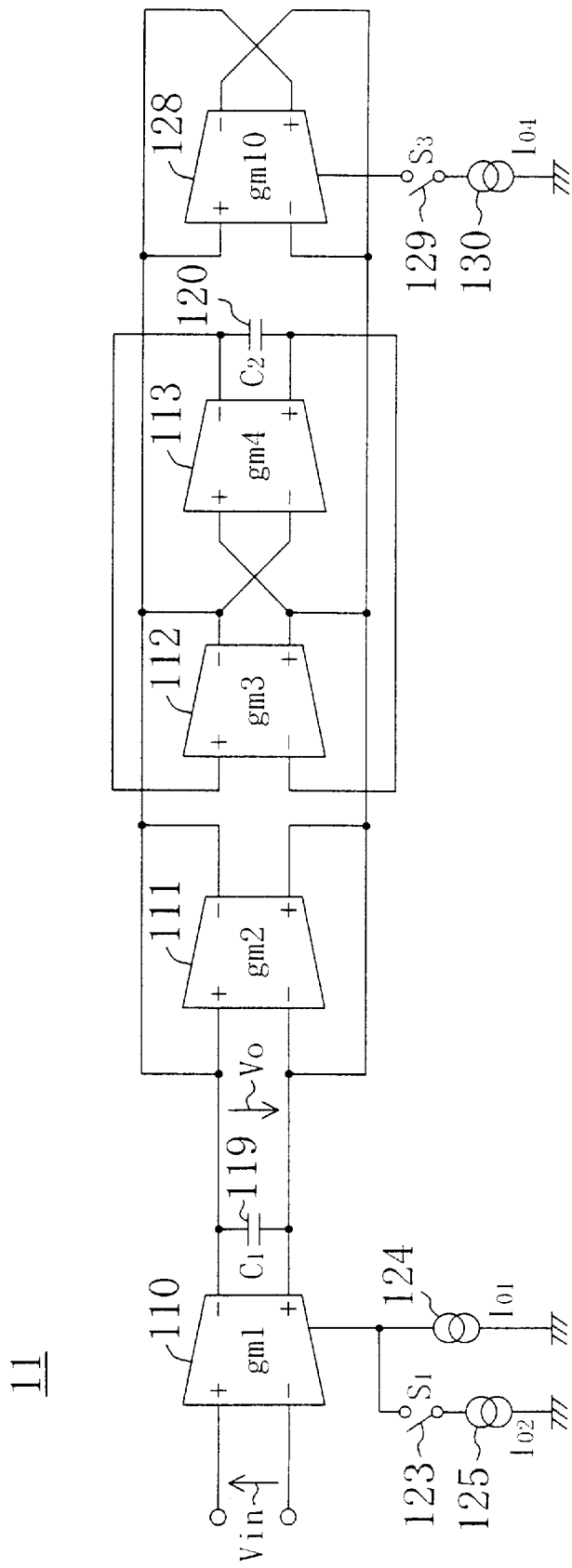
FIG. 6 is a block diagram illustrating a third exemplary configuration for the gm-C filter shown in FIG. 1.

FIG. 6 illustrates a third exemplary configuration for the gm-C filter 11 shown in FIG. 1. The gm-C filter 11 shown in FIG. 6 is a second order BPF including not only all the components of the filter 11 shown in FIG. 3 but also another gm amplifier 128, another switch $S_3$ 129 and another current source $I_{04}$ 130. The gm amplifier 128 has a transconductance gm10. The switch 129 is closed only while the filter 11 is being tuned.

While the switch 129 is closed, the transfer function H(s) of the gm-C filter 11 shown in FIG. 6 is given by $$H(s)=(s \cdot gm1/C_1)/\{(s^2+s \cdot (gm2-gm10)/C_1+gm3 \cdot gm4/(C_1 \cdot C_2)\} \quad (14)$$

Accordingly, if gm10 meeting the inequality of $$gm10>gm2 \quad (15)$$

is selected, then the gm amplifier 128 will serve as a negative resistor. As a result, a VCO, oscillating at the center frequency $f_0$ of the original filter, can be obtained. Accordingly, the number M of periods measured in Equation (4) can be increased, the adverse effects of noise can be weakened and the tuning precision improves.

Figure 7:
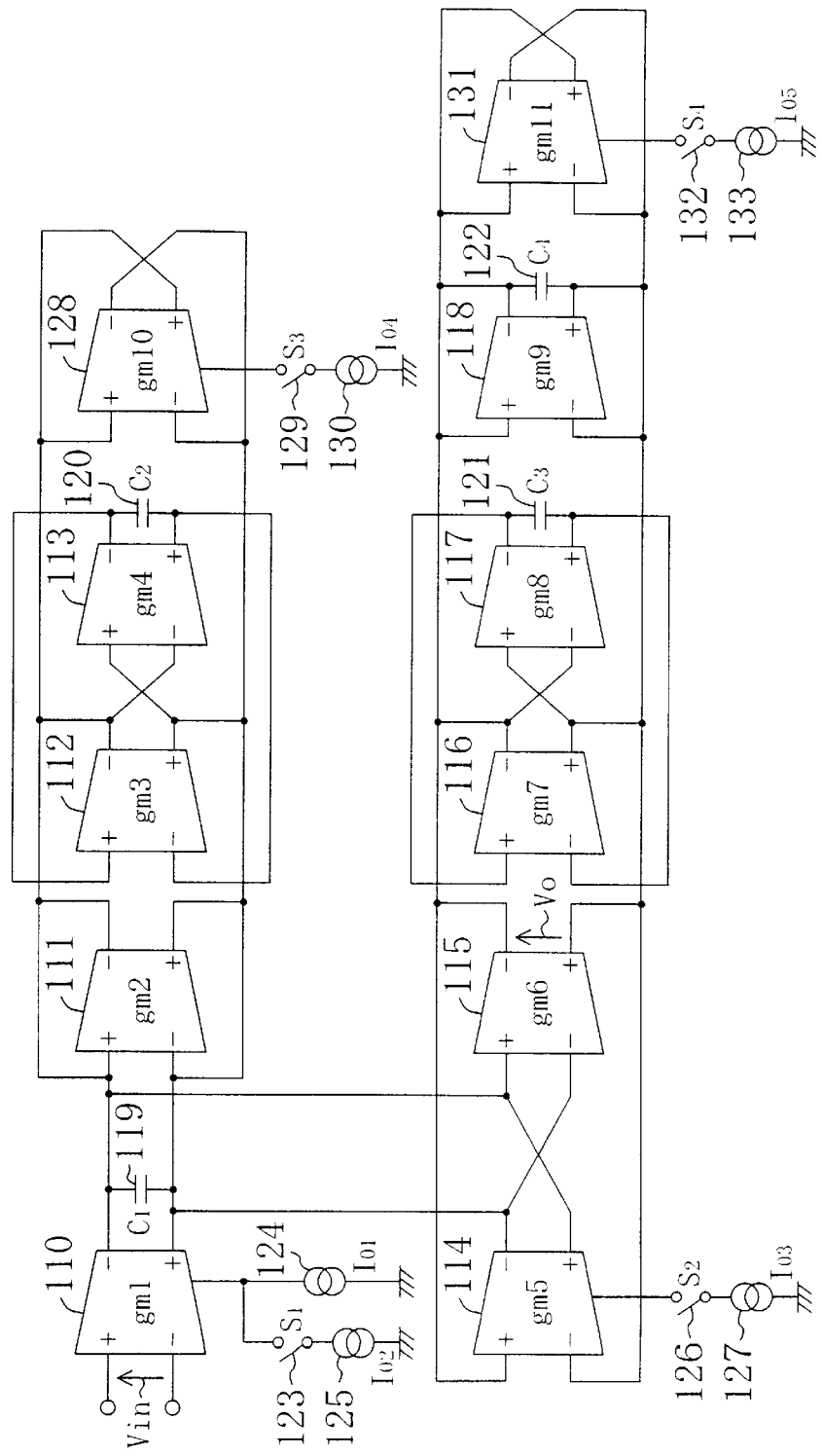
FIG. 7 is a block diagram illustrating a fourth exemplary configuration for the gm-C filter shown in FIG. 1.

FIG. 7 illustrates a fourth exemplary configuration for the gm-C filter 11 shown in FIG. 1. The gm-C filter 11 shown in FIG. 7 is a 4th order BPF including not only all the components of the filter 11 shown in FIG. 5 but also two more gm amplifiers 128 and 131, two more switches $S_3$ 129 and $S_4$ 132 and two more current sources $I_{04}$ 130 and $I_{05}$ 133. The gm amplifiers 128 and 131 have transconductances gm10 and gm11, respectively. The switches 129 and 132 are closed only while the filter 11 is being tuned.

While the switches 129 and 132 are closed, if gm10 and gm11 meeting the inequalities of:

$$gm10>gm2 \text{ and } gm11>gm9 \quad (16)$$

are selected, then the gm amplifiers 128 and 131 will serve as negative resistors. As a result, a VCO, oscillating at the center frequency $f_0$ of the original filter, can be obtained. Accordingly, the number M of periods measured in Equation (4) can be increased, the adverse effects of noise can be weakened and the tuning precision improves.

Figure 8:
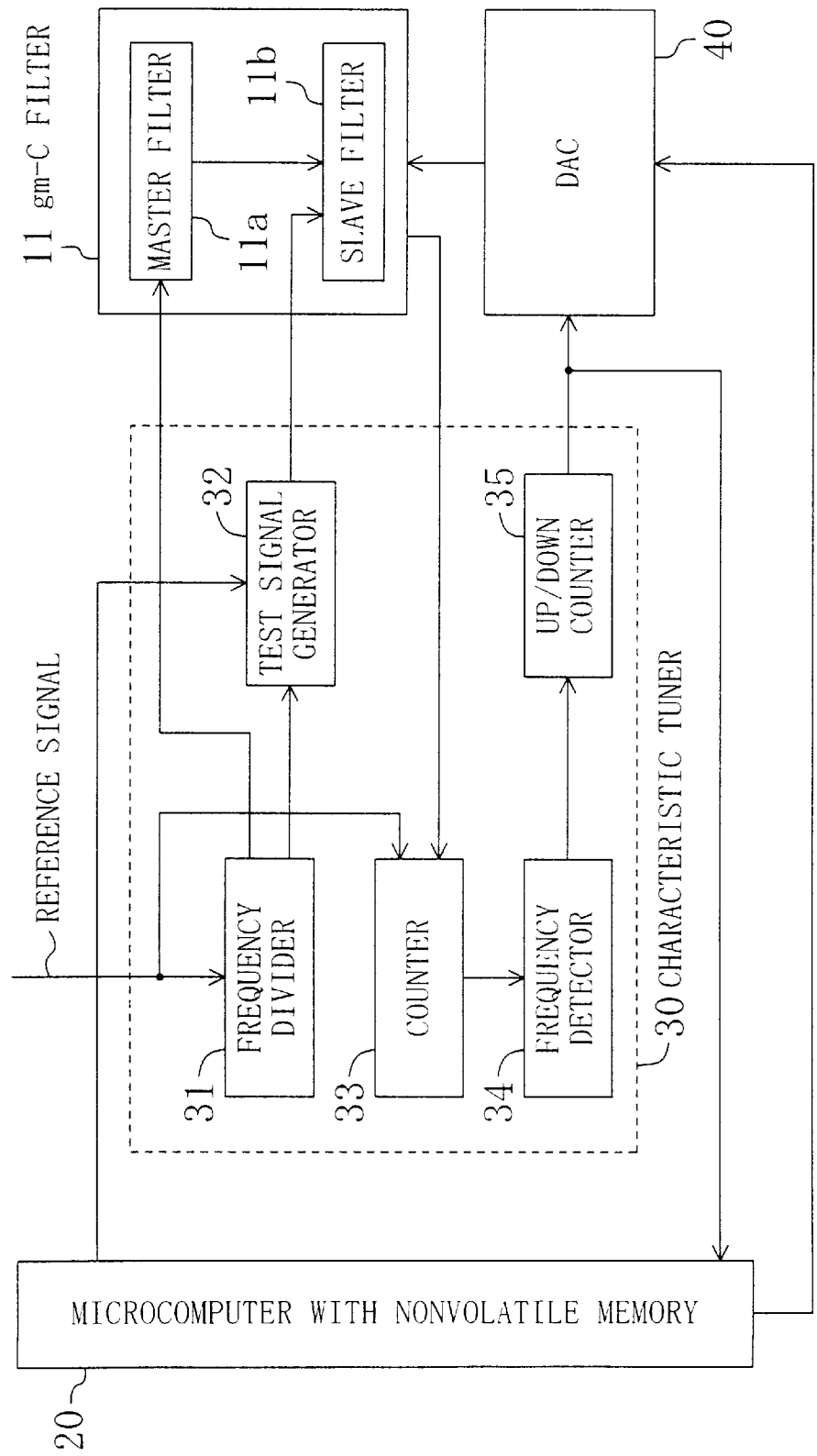
FIG. 8 is a block diagram illustrating another exemplary configuration for the automatic filter tuning control system of the present invention.

FIG. 8 illustrates another exemplary configuration for the automatic filter tuning control system of the present invention. In the system shown in FIG. 8, the gm-C filter 11 includes master and slave filters 11a and 11b, each of which can have its center frequency controlled variably in accordance with the control output of the DAC 40. The filter 11 shown in FIG. 8 can also have its configuration replaced with an alternative configuration realizing a high SNR only while the filter 11 is being tuned. The master filter 11a functions as a so-called "reference filter" for the slave filter 11b. A second reference signal, obtained by getting the frequency of the reference signal divided by the frequency divider 31, is delivered to the master filter 11a to carry out preliminary filter tuning control on the master filter 11a. Thereafter, the test signal generator 32 generates and outputs a test signal to the slave filter 11b, thereby tuning the slave filter 11b. In this manner, the center frequency can be adjusted with even higher precision.

Figure 9:
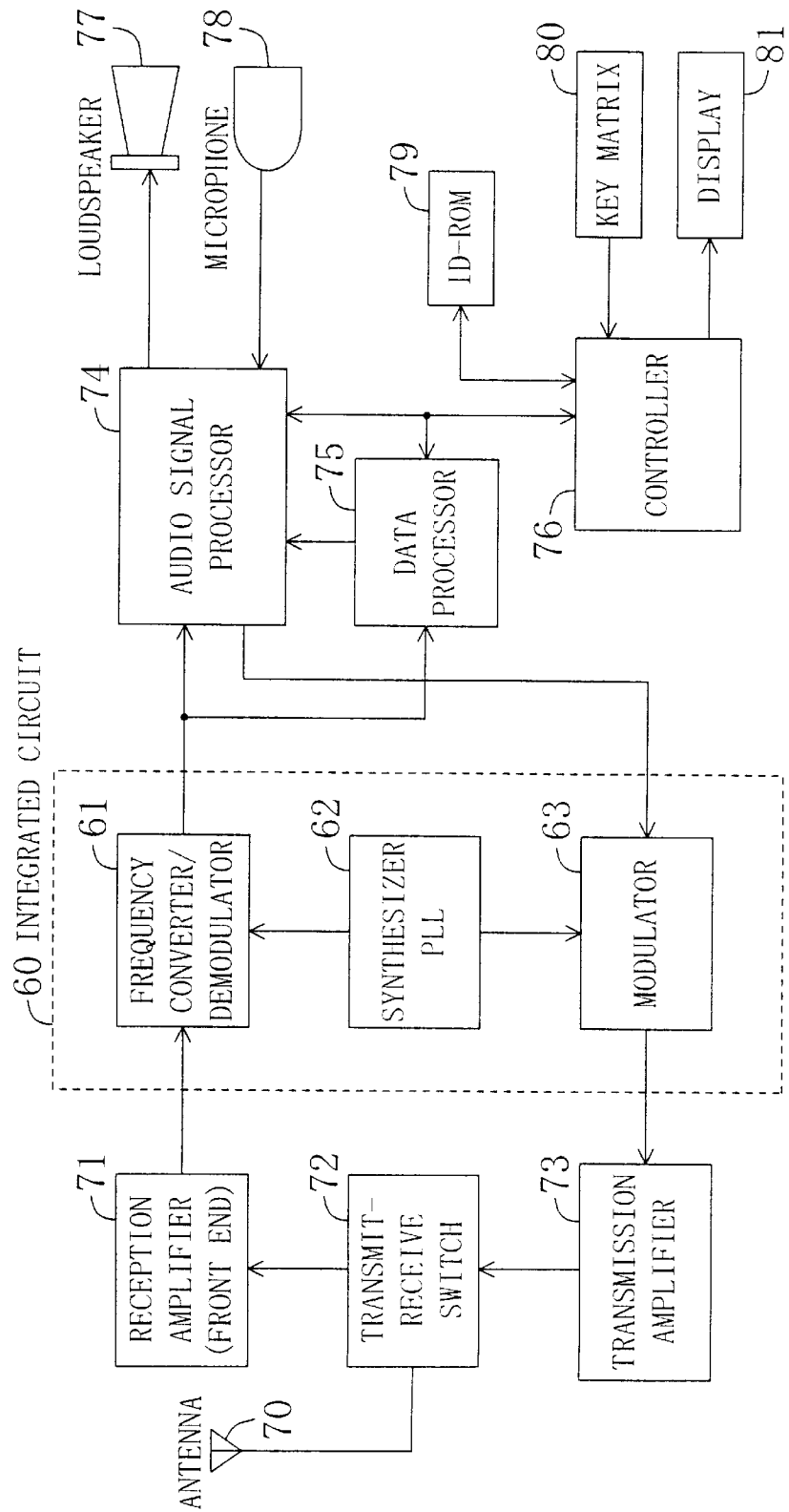
FIG. 9 is a block diagram illustrating a cell phone including the inventive automatic filter tuning control system.

FIG. 9 is a block diagram illustrating a cell phone including the inventive automatic filter tuning control system. The integrated circuit 60 shown in FIG. 9 includes frequency converter/demodulator 61, synthesizer PLL 62 and modulator 63 that are integrated together on a single chip. Although not shown in FIG. 9, a gm-C filter to be tuned and its automatic filter tuning control system are included in the frequency converter/demodulator 61.

In the cell phone shown in FIG. 9, an RF signal, received at an antenna 70, is led to a reception amplifier 71 by way of a transmit-receive switch 72. Then, the BPF included in the frequency converter/demodulator 61 selectively passes and amplifies the received signal. Specifically, in response to the output signal of the synthesizer PLL 62, one of the channels of the received signal is selected. Then, the signal is converted and amplified to have first and second intermediate frequencies (e.g., 400 kHz). As a result, a demodulated audio signal is output. This audio signal is decoded by an audio signal processor 74 and then output as a sound from a loudspeaker 77. A data signal is decoded by a data processor 75 and then the decoded data is presented by a controller 76 on a display. 81. On the other hand, an audio signal, input through a microphone 78, is encoded by the audio signal processor 74. A data signal, input through a key matrix 80, is encoded by the data processor 75. Then, the encoded versions of the audio and data signals are combined into a signal, which is subsequently input to the modulator 63. In response to the output signal of the synthesizer PLL 62, this combined signal is modulated into an RF signal, which is then input to a transmission amplifier 73. The transmission amplifier 73 amplifies the power of this modulated signal to a level required for transmission. Then, the amplified signal is transmitted from the antenna 70 by way of the transmit-receive switch 72. The cell phone further includes an ID-ROM 79 for storing the ID number of the phone itself.

The bandwidth of each channel for this cell phone is set to about ±10 kHz (i.e., about 5% with respect to the center frequency). To avoid the interference by an adjacent channel (i.e., a detuning signal with a frequency of 50 kHz), a BPF with a narrow bandwidth is used for the frequency converter/demodulator 61. By using the automatic filter tuning control system of the present invention for the receiver section of a cell phone like this, the center frequency can be adjusted highly precisely and the cell phone can operate in the standby mode for a longer time.

In the foregoing description, the filter to be tuned by the present invention is a gm-C filter. However, the present invention is naturally applicable to any other electronic filter with a center frequency that is controllable variably by voltage or current. Also, the application of the present invention is not limited to BPFs but includes HPFs and LPFs.

What is claimed is:

1. An automatic filter tuning control system for tuning a characteristic frequency of a filter to a target frequency, the system comprising:

circuit configuration replacing means for replacing an original circuit configuration of the filter with an alternative tuning-dedicated circuit configuration while the filter is being tuned, wherein the filter with the alternative configuration has the same characteristic frequency as that of the filter with the original configuration and shows a signal-to-noise ratio higher than that of the filter with the original configuration;

a characteristic tuner, which measures one or some periods of an oscillating waveform appearing at an output of the filter with the alternative configuration when an impulse signal, pulse signal or step signal is input as a test signal to the filter; detects the characteristic frequency of the filter in accordance with the period measured; and then supplies a tuning signal to the filter, thereby adjusting a difference between the characteristic and target frequencies;

wherein the characteristic tuner comprises:
 a frequency divider for dividing the frequency of a clock signal that has been delivered as a reference signal;
 a test signal generator for generating a test signal from the clock signal with the divided frequency;
 a counter for measuring one or some periods of the oscillating waveform, which appears at the output of the filter responsive to the test signal, synchronously with the clock signal;
 a frequency detector for detecting the characteristic frequency of the filter based on the period measured by the counter; and
 an up/down counter for changing the tuning signal in accordance with the difference between the detected characteristic frequency and the target frequency; and
 a controller, which issues a tuning instruction to start the characteristic tuner and then stores a level of the tuning signal when the difference between the characteristic and target frequencies of the filter enters a tolerance range, wherein in operating the filter, the controller restores the filter to the original configuration, stops operating the characteristic tuner and controls the characteristics of the filter using the tuning signal stored.

2. The system of claim 1, wherein the filter is a gm-C filter comprising a plurality of transconductance amplifiers and a plurality of capacitors.

3. The system of claim 1, wherein the circuit configuration replacing means comprises means for boosting a gain of the filter being tuned.

4. The system of claim 1, wherein the circuit configuration replacing means comprises means for increasing a quality factor of the filter being tuned.

5. The system of claim 1, wherein the circuit configuration replacing means comprises means for oscillating the filter being tuned at the characteristic frequency of the filter.

6. The system of claim 1, wherein the controller averages levels of the tuning signal that has been input to the filter at multiple tuning attempts, stores the tuning signal with the averaged level and controls the characteristics of the filter using the tuning signal with the averaged level.

7. The system of claim 1, further comprising a digital-to-analog converter, which receives the tuning signal as a digital quantity from the characteristic tuner or the controller and supplies an analog control signal, corresponding to the tuning signal, to the filter.

8. The system of claim 1, further comprising a phase-locked loop circuit for generating the reference signal.

9. The system of claim 1, wherein the greater the difference between the detected characteristic frequency and the target frequency, the more greatly the up/down counter changes the tuning signal.

10. The system of claim 1, wherein when the detected characteristic frequency is close to the target frequency, the up/down counter decreases control sensitivity of the tuning signal.

11. The system of claim 1, wherein the filter comprises a master filter and a slave filter, each of which has its characteristic frequency controlled variably responsive to the tuning signal, and wherein after the master filter has been tuned in advance in response to a second reference signal, obtained by dividing the frequency of the reference signal, the slave filter is tuned in response to the test signal.

12. A cellular phone comprising the automatic filter tuning control system as recited in any one of claims 1–6 or 7–11 in a receiver section thereof.

* * * * *

UNITED STATES PATENT AND TRADEMARK OFFICE
CERTIFICATE OF CORRECTION

PATENT NO.   : 6,512,414 B2
DATED        : January 28, 2003
INVENTOR(S)  : Akio Yokoyama et al.

It is certified that error appears in the above-identified patent and that said Letters Patent is hereby corrected as shown below:

<u>Column 10,</u>
Lines 55 and 56, change "or 7-11" to -- and 8-12 --

Signed and Sealed this

Twenty-third Day of December, 2003

JAMES E. ROGAN
*Director of the United States Patent and Trademark Office*